United States Patent [19]

Kadota et al.

[11] Patent Number: 5,838,217
[45] Date of Patent: Nov. 17, 1998

[54] LONGITUDINALLY COUPLING ACOUSTIC SURFACE WAVE DOUBLE MODE FILTER UTILIZING END-FACE REFLECTING WAVES

[75] Inventors: Michio Kadota, Kyoto; Kazuhiko Morozumi, Ishikawa-ken, both of Japan

[73] Assignee: Murata Manufacturing Co., Ltd., Japan

[21] Appl. No.: 704,942

[22] Filed: Aug. 30, 1996

[30] Foreign Application Priority Data

Aug. 30, 1995 [JP] Japan .................................. 7-222139

[51] Int. Cl.⁶ .................................................. H03H 9/64
[52] U.S. Cl. ...................... 333/193; 333/194; 310/313 B
[58] Field of Search .................................. 333/193–196; 310/313 R, 313 B, 313 C, 313 D

[56] References Cited

U.S. PATENT DOCUMENTS 4,204,178  5/1980  Mitchell .............................. 310/313 D
5,184,042  2/1993  Kadota et al. ....................... 333/193 X

FOREIGN PATENT DOCUMENTS 2000409   1/1979  United Kingdom .
2244880  12/1991  United Kingdom .

OTHER PUBLICATIONS

"Ceramic Resonators Using BGS Waves"; Michio Kadota, Kazuhiko Morozumi, Toshiaki Ikeda and Toru Kasanami; Proceedings of 12th Symposium on Ultrasonic Electronics, Tokyo 1991 Japanese Journal of Applied Physics, vol. 31 (1992) Supplement 31–1, pp. 219–221.

Primary Examiner—Benny Lee
Assistant Examiner—Barbara Summons
Attorney, Agent, or Firm—Ostrolenk, Faber, Gerb & Soffen, LLP

[57] ABSTRACT

A double-mode SAW filter of a longitudinally coupling type utilizing an SH-type surface wave, which is structured with first and second IDTs formed on said piezoelectric substrate to cause reflection of an SH-type surface wave between opposite two end faces, thereby creating a standing wave.

11 Claims, 6 Drawing Sheets

LONGITUDINALLY COUPLING ACOUSTIC SURFACE WAVE DOUBLE MODE FILTER UTILIZING END-FACE REFLECTING WAVES

BACKGROUND OF THE INVENTION

This invention relates to a surface acoustic wave (SAW) filter utilizing an SH-type surface wave, and more particularly to a SAW filter of a longitudinally coupling type.

Double mode SAW filters of a longitudinally coupling type are well known. One such filter is shown in FIG. 1. SAW filter 1 has first and second interdigital transducers, (hereinafter referred to as "the IDT(s)"), 3, 4 disposed on a rectangular piezoelectric substrate 2, and reflectors 5, 6 formed on the opposite sides thereof. The IDT 3 has a pair of comb-shaped electrodes 3a, 3b, each of which has a plurality of electrode fingers which are interleaved with each other. Similarly, the IDT 4 has a pair of interleaved comb-shaped electrodes 4a, 4b.

The distance between adjacent electrode fingers is $\lambda/4$, $\lambda$ being like the wavelength of the surface wave to be oscillated, and the width of each electrode digit is $\lambda/4$. The distance between adjacent electrodes of the IDT 3 and the IDT 4 is also $\lambda/4$.

In the SAW filter 1, the comb-shaped electrodes 3a on one side of the IDT 3 constitute an input end and the comb-shaped electrodes 4a on one side of the IDT 4 constitute an output end. The comb-shaped electrodes 3b, 4b are connected to ground.

When an input voltage is applied to the IDT 3, a surface wave is generated in IDT 3. The surface wave propagates in a direction perpendicular to a direction of extension of the electrode fingers so as to be reflected between the reflectors 5, 6, resulting in the generation of a standing wave. An output, which is a function of the standing wave, is taken out of the IDT 4.

The SAW filter 1 operates as a double-mode SAW filter of a longitudinally coupling type having a basic mode shown by a solid line A in FIG. 2 and a higher order mode, or an anti-symmetric mode, shown by the broken line B in FIG. 2.

However, since the SAW filter 1 shown in FIG. 1 has a structure in which a standing wave is created by reflection of a surface wave between the reflectors 5, 6, the overall size of the filter has to be increased by an amount equal to the combined size of the reflectors 5, 6. Additionally, the electro-mechanical coupling coefficient for the piezoelectric substrate 2 is not very large with the result that the filter is limited to a narrowed band width.

BRIEF DESCRIPTION OF THE INVENTION

It is an object of the present invention to provide a double-mode SAW filter of a longitudinally coupling type which has a relatively small size and a relatively broad band width.

According to a broad aspect of the invention, a double-mode acoustic surface wave filter of a longitudinally coupling type which utilizes an end-face reflecting SH-type surface wave comprises:

a piezoelectric substrate having opposed end faces;

first and second interdigital transducers formed on the piezoelectric substrate and having electrode fingers extending generally parallel with same end faces; and wherein an SH-type surface wave is caused to be reflected between the opposite two end faces.

The SAW filter of the invention is a double-mode SAW filter of a longitudinally coupling type. In this specification, an SH-type surface wave refers broadly to surface waves which have a displacement perpendicular to a direction of propagation thereof and contain as a principal component a directional component parallel to the surface of a substrate. Such waves include an SH-type surface wave a Leaky wave, a Love wave, a BGS wave, and so on, of an SH-type.

In order to define a double-mode SAW filter of the longitudinally coupling type, the present invention preferably includes first and second IDTs formed on a piezoelectric substrate which has opposite end faces. Since it is constituted as a surface-wave device of an end-face reflection type utilizing a SH-type surface wave, a surface wave is reflected between the opposite two end faces of the piezoelectric substrate, resulting in the formation of a standing wave.

In the SAW filter of the present invention, it is not necessary to provide reflectors on the outer sides of the IDTs. It is therefore possible to reduce the size of the piezoelectric substrate. Also losses which would otherwise be caused by the reflectors are avoided. It is therefore possible to constitute a SAW filter with a band characteristic which is broader than the conventional SAW filters, when employing a piezoelectric substrate with the same electro-mechanical coupling coefficient.

In accordance with the present invention the piezoelectric substrate which is opposite to the surface on which the first and second IDTs are formed is preferably roughened. This reduces the affect of a bulk wave reflected by the opposite surface of the piezoelectric substrate to the surface formed with the first and second IDTs. As a result, unwanted spurious characteristics can be reduced.

In the preferred embodiment, the outermost electrode fingers of the first and second interdigital transducers have a width within a range of from $\lambda/8$ to $7\lambda/16$, wherein $\lambda$ is the wavelength of the surface wave generated by the SAW filter. This reduces ripples within the passband of the filter.

Preferably, the distance L between the opposite two end faces of the substrate should fall within a range of:

$$\frac{\lambda}{2} \times n \leq L \leq \frac{\lambda}{2} \times n + \frac{7}{8} \lambda \qquad \text{Equation (1)}$$

where n is an integer. This effectively reduces ripples within the passband.

BRIEF DESCRIPTION OF THE DRAWINGS

For the purpose of illustrating the invention, there is shown in the drawing a form which is presently preferred, it being understood, however, that the invention is not limited to the precise arrangement and instrumentality shown.

DETAILED DESCRIPTION OF THE PREFERRED EMBODIMENT

Figure 3:
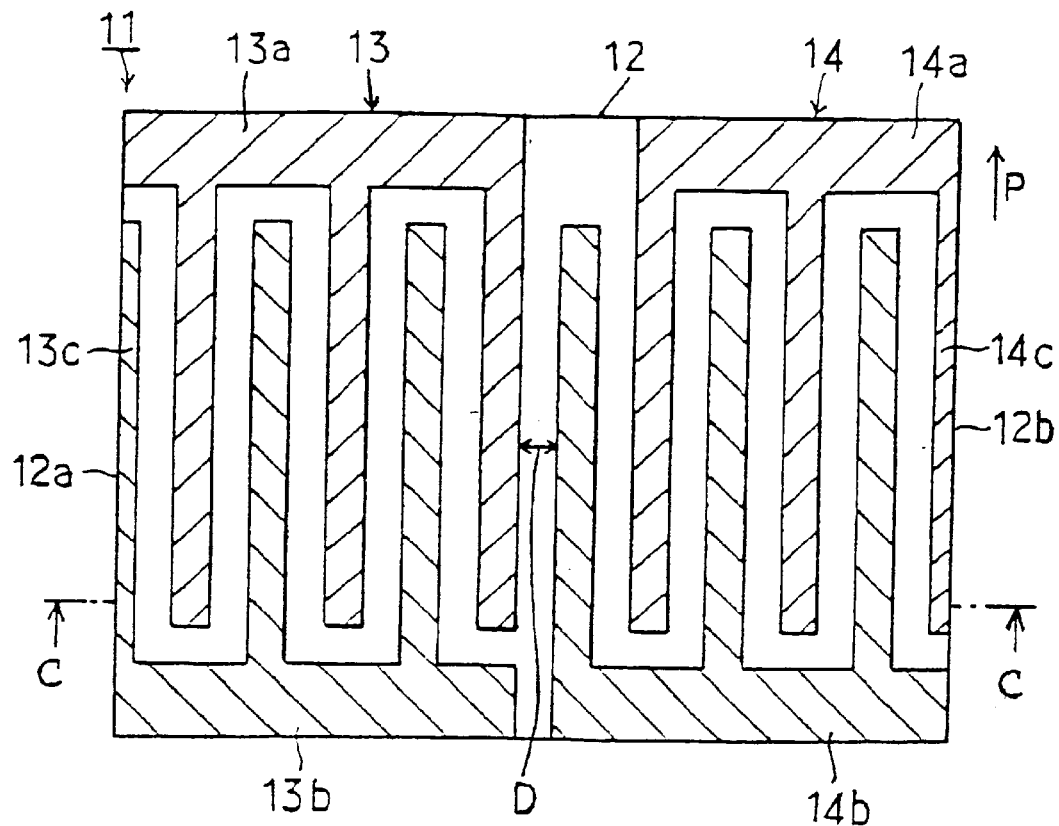
FIG. 3 is a plan view of a SAW filter according to one embodiment of the present invention.
Figure 4:
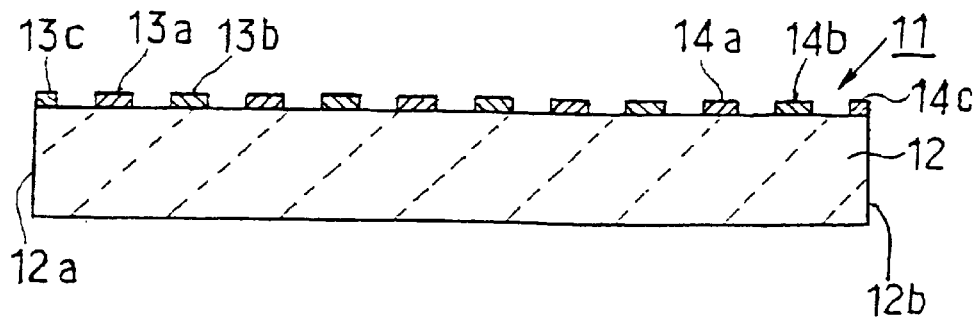
FIG. 4 is a cross-sectional view taken on line C—C of FIG. 3.
Figure 5:
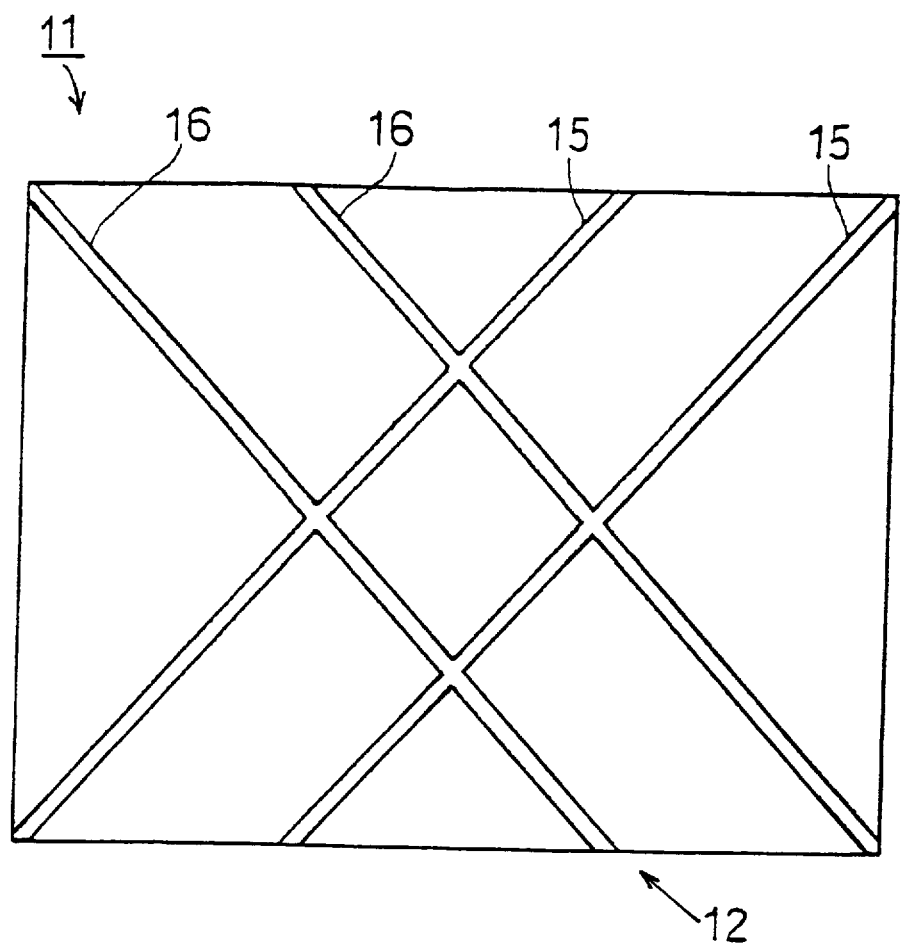
FIG. 5 is a bottom view of the SAW filter shown in FIG. 3.

Referring now to the drawings wherein like numerals indicate like elements, there is shown in FIGS. 3–5, a SAW filter constructed in accordance with the principles of the present invention and designated generally as 11. SAW filter 11 comprises a piezoelectric substrate 12 having a pair of IDTs 13, 14 formed thereon. Substrate 12 is preferably formed of piezoelectric single crystal, such as an $LiTaO_3$ piezoelectric single crystal and an $LiNbO_3$ piezoelectric single crystal, or piezoelectric ceramics on a PZT base. The piezoelectric substrate 12 is preferably structured such that the polarization axis is oriented in the direction of the arrow P in the FIG. 3. The piezoelectric substrate 12 has a pair of end faces 12a, 12b.

IDT 13 comprises a pair of comb-shaped electrodes 13a, 13b which include a plurality of interleaved electrode fingers.. The outermost electrode finger 13c (with respect to a direction of propagation of the surface wave) preferably has a width which is between $\lambda/8$ to $7\lambda/16$, $\lambda$ being the wavelength of the surface wave. The remaining electrode fingers preferably have a width of $\lambda/4$. The distance between adjacent electrode fingers is preferably $\lambda/4$.

Similarly, IDT 14 has a pair of interdigital comb-shaped electrodes 14a, 14b which are structurally similar to comb-shaped electrodes 13a, 13b. The outermost electrode finger 14c preferably has a width within a range from $\lambda/8$ to $7\lambda/16$. The remaining electrode fingers preferably have a width of $\lambda/4$. The distance between adjacent electrode fingers is preferably $\lambda/4$. The distance between the IDTs 13, 14, i.e., the distance D between the innermost electrode finger of the IDT 13 and the innermost electrode finger of the IDT 14, is preferably $\lambda/4$.

If an input voltage is applied between the comb-shaped electrodes 13a, 13b of the IDT 13, a BGS wave is generated. The generated BGS wave propagates toward the end faces 12a and 12b and is reflected by the end faces 12a, 12b to combine together to form a standing wave including a basic wave and a higher-order mode wave. An output based on the standing wave is taken out between the comb-shaped electrodes 14a, 14b.

The SAW filter 11 can be operated as a double-mode SAW filter of the longitudinally coupling type utilizing a BGS wave, by connecting the comb-shaped electrodes 13b, 14b to ground, by using the comb-shaped electrode 13a as an input end and by using the comb-shaped electrode 14a as an output end.

Figure 1:
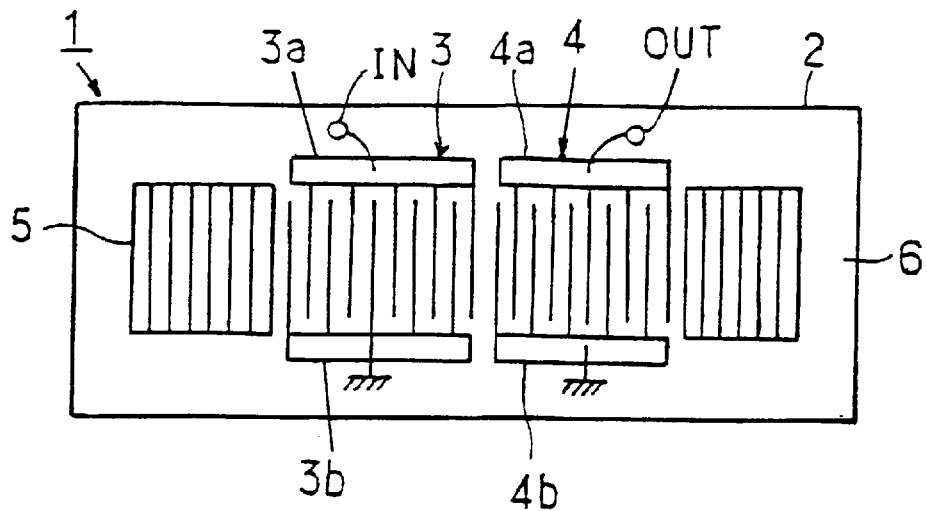
FIG. 1 is a schematic plan view of a conventional double-mode SAW filter of a longitudinally coupling type.
Figure 2:
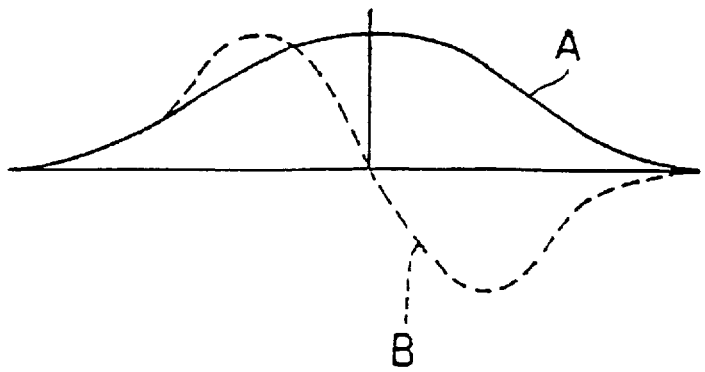
FIG. 2 is a schematic diagram illustrating a surface wave oscillated in the conventional double-mode SAW filter of the longitudinally coupling type.

In the SAW filter 11 of the present embodiment, it is not necessary to provide reflectors on the outer sides of the IDTs 13, 14. As a result, the piezoelectric substrate 12 may be smaller than that required with the prior art SAW filter of FIG. 1, thereby providing a surface horizontal wave filter of reduced size. Since reflectors are not used, the insertion losses created by those reflectors is also avoided, thereby providing a SAW filter having an increased bandwidth. Furthermore, by utilizing electrode fingers 13c, 14c having widths which fall within the ranges noted above, it is possible to suppress ripples within the passband.

In the preferred embodiment, the back surface of the substrate is roughened to suppress unwanted spurious signals resulting from a bulk wave appearing in a filtering characteristic. This may be done in many ways. For example, a plurality of grooves (FIG. 5) 15, 16 may be formed in the back surface of the piezoelectric substrate 12. Alternatively, the back surface of the piezoelectric substrate may be roughened by forming random recesses in the back surface of the piezoelectric substrate 12 or grinding the back surface of the piezoelectric substrate 12 using abrasive or a grinding apparatus.

In the embodiment described, the SAW filter 11 of the surface horizontal wave type utilizes a BGS wave. However, other SH-type surface waves, such as a Love wave or a Leaky acoustic wave, may be utilized instead of a BGS wave. It has been impossible to employ a leaky acoustic wave in the conventional SAW filter of the longitudinally coupling type because of increase of losses in surface wave energy. According to the SAW filter of the present invention, the SAW filter 11 may be constituted with using a leaky acoustic wave, because the reflection between the end faces 12a, 12b acts to prevent reduction of surface-wave energy.

The invention will be explained with reference to the examples given below.

EXAMPLE 1

A piezoelectric substrate 12 formed of piezoelectric ceramics based on lead titanate zirconate having a size of 1.3×0.8×0.5 mm in thickness was used. IDTs 13, 14, each of which included seven pairs of electrode fingers, were formed by depositing aluminum over the entire upper surface of the piezoelectric substrate 12 and etching the aluminum using masking techniques. Each electrode finger had a width of 30.3 $\mu$m, except for electrode fingers 13c, 14c which had a width of 22 $\mu$m. The center-to-center interval between electrode finger was 60.6 $\mu$m. Grooves 15, 16 were formed on the back surfaces of the substrate 12.

Figure 6:
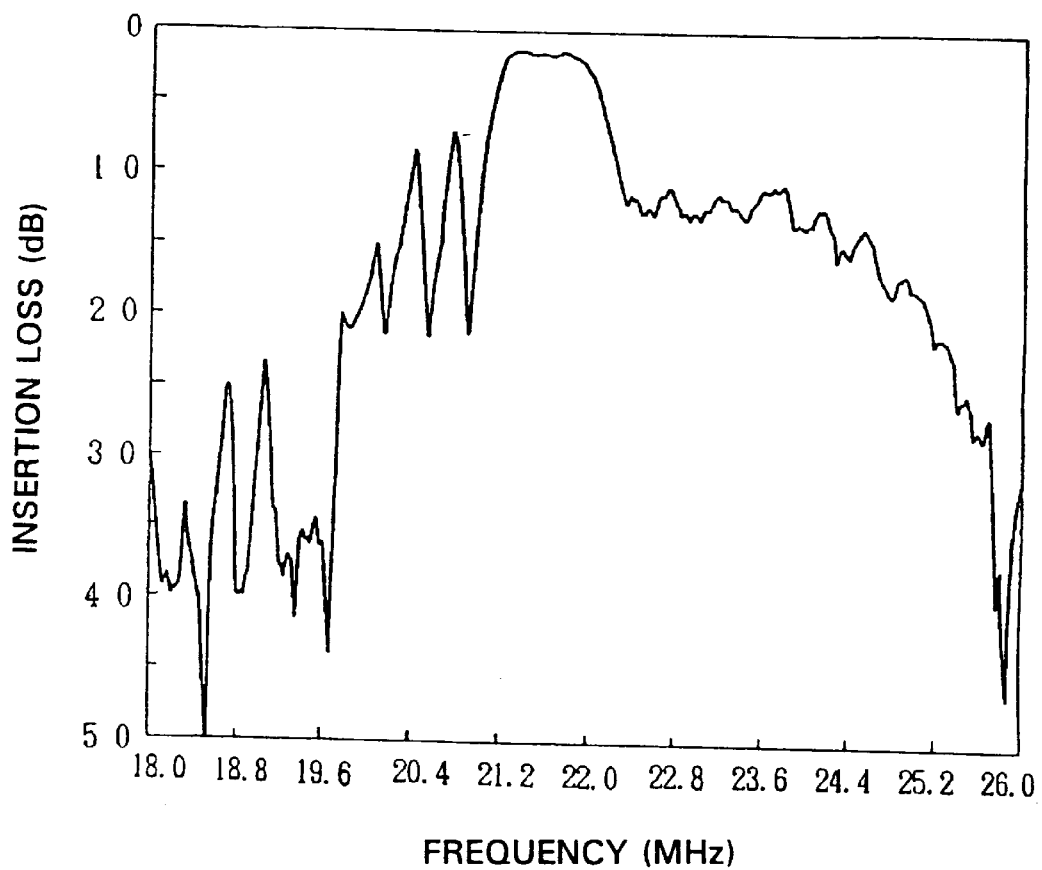
FIG. 6 is a graph showing the insertion loss vs. frequency characteristics of a first example of a SAW filter constructed in accordance with the principles of the present invention.

The insertion loss vs. frequency characteristics for the SAW filter of the first example is shown in FIG. 6. As shown therein, the SAW filter of the first example provides a pass band over 20.9 to 21.9 MHz. Also, by magnifying the characteristic shown in FIG. 6, it was confirmed that the insertion loss within the pass band was 1.3 Db and a 3-Db band width, i.e., the band width for which the insertion loss ranges up to 3 dB, lies in 4.5% with respect to a center frequency for the filter.

EXAMPLE 2

A SAW filter of a second example was manufactured under conditions similar to example 1, except that the grooves 15, 16 were not formed in the back surface of a piezoelectric substrate 12. The insertion loss vs. frequency characteristics of that filter is shown in FIG. 7.

Figure 7:
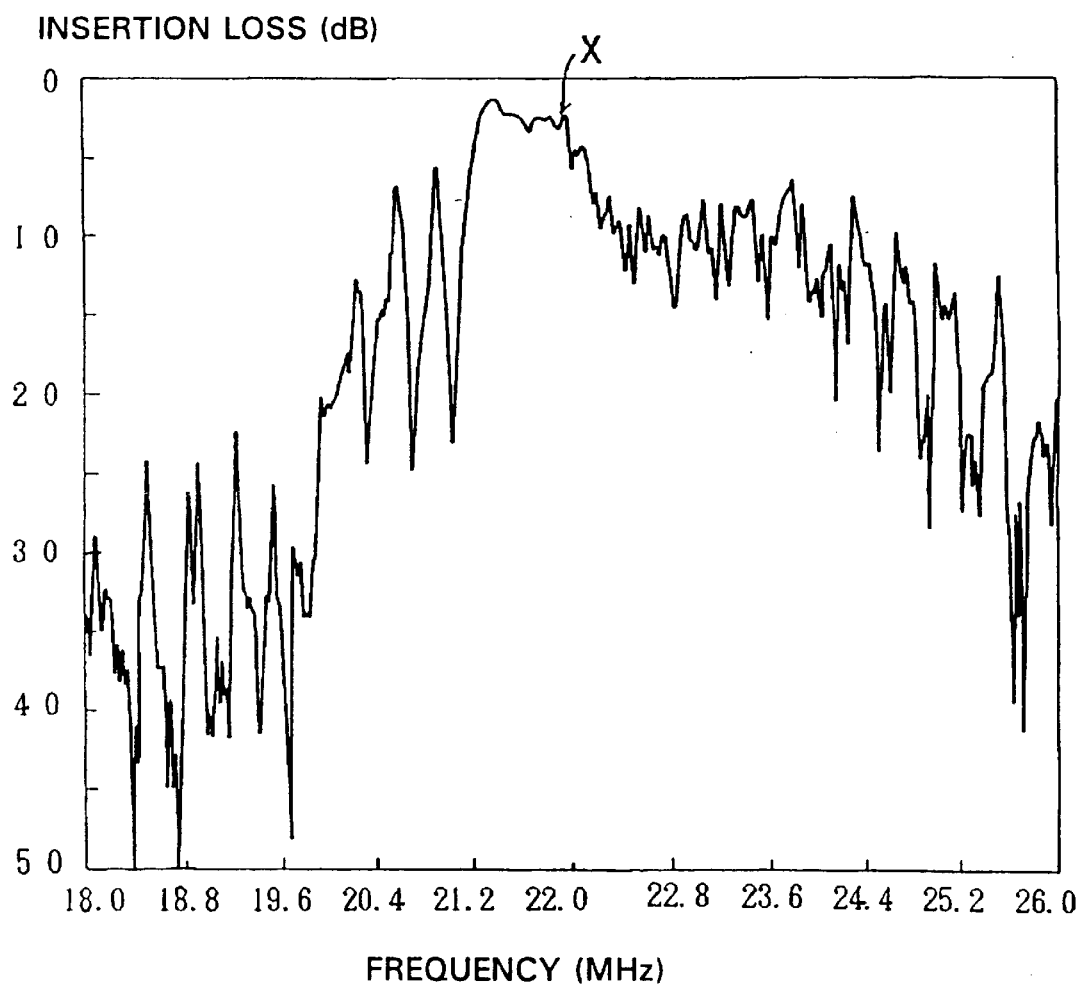
FIG. 7 is a graph showing insertion loss vs. frequency characteristics of a second example of a SAW filter constructed in accordance with the principles of the present invention.

As clear from the comparison of FIGS. 6 and 7 the SAW filter of the second example exhibited greater ripples within a pass-band of the SAW filter as shown by the arrow X in FIG. 7. However, the pass band, i.e., the 3-dB band width, was as large as 4.5% and the insertion loss for the pass band was as small as 1.3 dB.

EXAMPLE 3

A SAW filter of a third example was manufactured under conditions similar to the SAW filter of example 1, except that the width of outermost electrode fingers 13c, 14c was 7.6 $\mu$m, or $\lambda/16$. The attenuation vs. frequency characteristics of the SAW filter is shown in FIG. 8.

Figure 8:
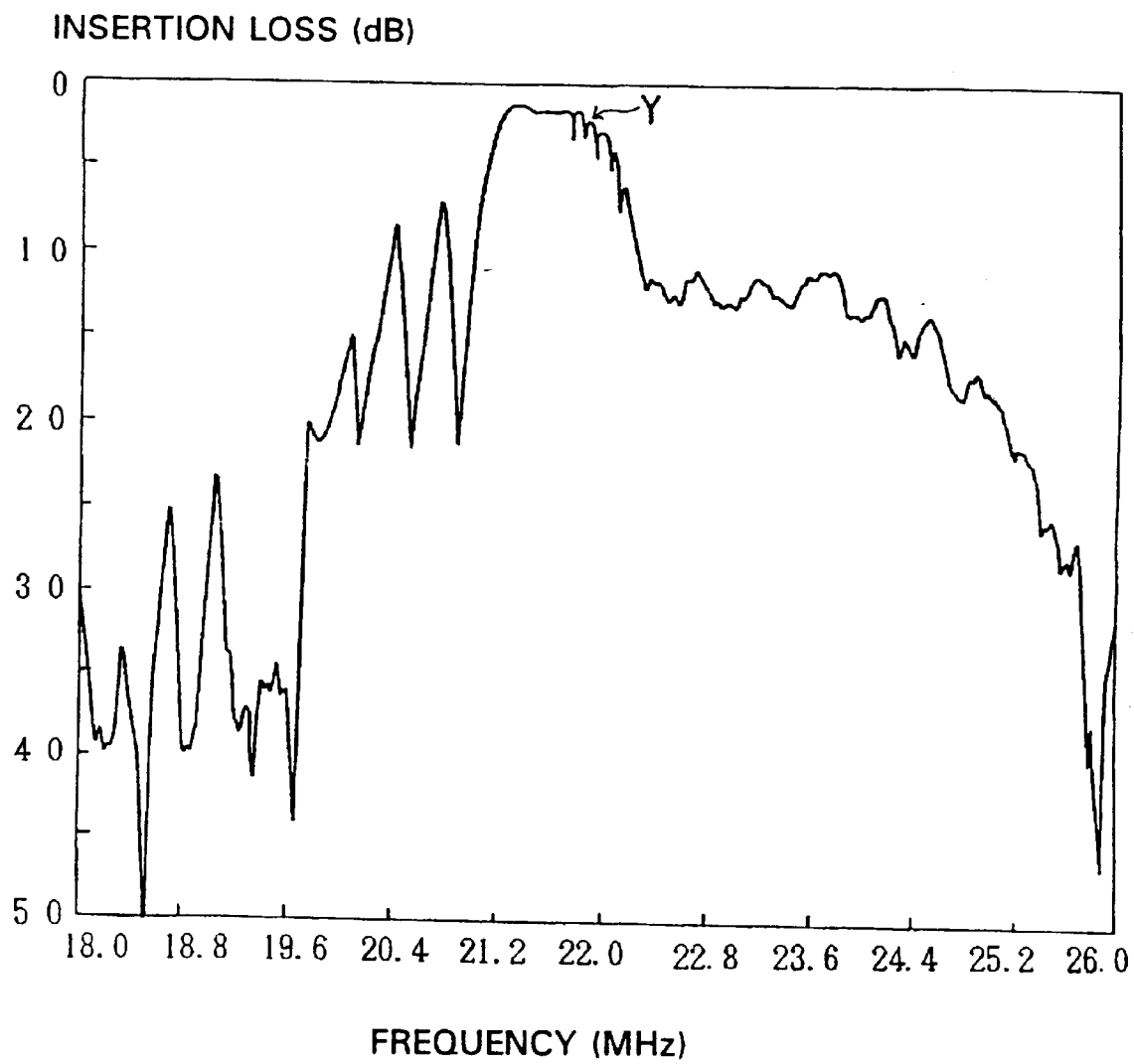
FIG. 8 is a graph showing insertion loss vs. frequency characteristics of a third example of a SAW filter constructed in accordance with the principles of the present invention.

As clear from FIG. 8, the pass band extends from 20.9 to 21.9 Mhz and the 3-dB band width as an index for the pass band is as large as 4.5% which is similar to the SAW filter of Example 1. It is therefore understood that a SAW filter having a relatively wide pass band can be realized by this example. Also, the insertion loss within the pass band is 1.5 dB. As such, the present example attains a filtering characteristic which is equivalent to that of the SAW filter of Example 1. In the SAW filter of Example 3, however, it is recognized that some ripples shown by the arrow Y had occurred within the pass band.

As clear from the result of Examples 1 to 3, the present invention provides a SAW filter having a wide pass-band. It is also clear that unwanted spurious characteristics can be suppressed by roughening the back surface of the piezoelectric substrate and that ripples can be effectively suppressed by forming the electrode fingers with a width of 22 μm, or 3λ/16.

Experiments were conducted to test SAW filters having outermost electrode fingers 13c, 14c of varying widths. It was determined that ripples within the pass-band can be effectively suppressed, similarly to the characteristics shown in FIG. 6, by setting the width between λ/8 and 7λ/16.

In the foregoing embodiments, the width of the electrode fingers and the gap therebetween are equal. However they may be varied as desired. In such cases, a similar effect is obtainable by forming the width between the two end faces 12a, 12b of the substrate meets by the equation (1) stated above.

In the present invention, a double-mode SAW filter of a longitudinally coupling type is constituted as a surface wave device of an end-face reflection type with the utilization of an SH-type surface wave, without necessitating the provision of reflectors on the both sides of IDTs. It is therefore possible to reduce the size of the SAW filter small by an amount of unnecessitated spacing for providing reflectors.

In addition, the absence of using reflectors allows avoidance of increase in insertion loss by reflectors, which makes it possible to realize a SAW filter which is small in insertion loss and hence broad in band as compared with the conventional double-mode SAW filter of the longitudinally coupling type.

What is claimed is:

1. An acoustic surface wave filter of a longitudinally coupling type utilizing an end-face reflecting SH-type surface wave, said filter comprising:

a piezoelectric substrate having opposite end faces;

first and second interdigital transducers formed on said piezoelectric substrate and having electrode digits extending parallel to said end faces in such a manner that an SH-type surface wave generated when an input signal is applied to said transducers is caused to be reflected between said opposite two end faces and that said acoustic surface wave filter operates as a double-mode SAW filter having a basic mode and a higher order mode.

2. An acoustic surface wave filter according to claim 1, wherein said piezoelectric substrate is roughened in a surface opposite to a surface on which said first and second interdigital transducers are formed.

3. An acoustic surface wave filter according to claim 1 or 2, wherein said electrode digits of said first and second interdigital transducers includes electrode digits existing on the outer ends relative to a direction of propagation of a surface wave and having a width thereof determined within a range of from λ/8 to 7λ/16, provided that a wavelength of the surface wave is λ.

4. An acoustic surface wave filter according to claim 1 or 2, wherein the distance L between said end faces of said substrate falls within a range of:

$$\frac{\lambda}{2} \times n \leq L \leq \frac{\lambda}{2} \times n + \frac{7}{8} \lambda \qquad \text{Equation (1)}$$

where n is an integer.

5. An acoustic surface wave filter according to claim 1 or 2, wherein a gap is formed between an innermost electrode finger of said first interdigital transducer and an innermost electrode finger of said second interdigital transducer, said gap having a width which is substantially equal to a width of each of said innermost electrode fingers.

6. An acoustic surface wave filter according to claim 1, wherein said SH-type surface wave is selected from the group consisting of a Leaky wave, a Love wave and a BGS wave.

7. An acoustic surface wave filter of a longitudinally coupling type utilizing an end-face reflecting SH-type surface wave, said filter comprising:

a piezoelectric substrate having opposite end faces;

a first interdigital transducer formed on said piezoelectric substrate and having electrode digits extending parallel to said end faces a second interdigital transducer formed adjacent to said first interdigital transducer and having electrode digits extending parallel to said end faces in such a manner that an SH-type surface wave generated when an input signal is applied to said transducers is caused to be reflected between said opposite two end faces and that said acoustic surface wave filter operates as a double-mode SAW filter having a basic mode and a higher order mode.

8. An acoustic surface wave filter according to claim 7, wherein said piezoelectric substrate is roughened in a surface opposite to a surface on which said first and second interdigital transducers are formed.

9. An acoustic surface wave filter according to claim 7 or 8, wherein said electrode digits of said first and second interdigital transducers includes electrode digits existing on the outer ends relative to a direction of propagation of a surface wave and having a width thereof determined within a range of from λ/8 to 7 λ/16, provided that a wavelength of the surface wave is λ.

10. An acoustic surface wave filter according to claim 7 or 8, wherein the distance L between said end faces of said substrate falls within a range of:

$$\frac{\lambda}{2} \times n \leq L \leq \frac{\lambda}{2} \times n + \frac{7}{8} \lambda \qquad \text{Equation (1)}$$

where n is an integer.

11. An acoustic surface wave filter according to claim 7, wherein said SH-type surface wave is selected from the group consisting of a Leaky wave, a Love wave and a BGS wave.

* * * * *